United States Patent
Ikegawa et al.

(10) Patent No.: US 8,980,371 B2
(45) Date of Patent: Mar. 17, 2015

(54) FILM DEPOSITION METHOD

(71) Applicant: Tokyo Electron Limited, Tokyo (JP)

(72) Inventors: Hiroaki Ikegawa, Yamanashi (JP); Masahiko Kaminishi, Iwate (JP); Kosuke Takahashi, Iwate (JP); Yu Sasaki, Iwate (JP); Jun Ogawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/088,727

(22) Filed: Nov. 25, 2013

(65) Prior Publication Data
US 2014/0147591 A1    May 29, 2014

(30) Foreign Application Priority Data
Nov. 26, 2012  (JP) .................................. 2012-257651

(51) Int. Cl.
C23C 16/44      (2006.01)
C23C 16/52      (2006.01)
C23C 16/458     (2006.01)

(52) U.S. Cl.
CPC ...................................... *C23C 16/52* (2013.01)
USPC .................................................. 427/255.28

(58) Field of Classification Search
CPC ........ C23C 16/44; C23C 16/52; C23C 16/458
USPC .............................. 427/255.23, 255.28, 255.5
See application file for complete search history.

(56) References Cited

U.S. PATENT DOCUMENTS

| 6,812,157 | B1 * | 11/2004 | Gadgil ........................... 438/763 |
| 6,869,641 | B2 * | 3/2005 | Schmitt ....................... 427/248.1 |
| 6,902,620 | B1 * | 6/2005 | Omstead et al. .............. 117/107 |
| 2006/0073276 | A1 * | 4/2006 | Antonissen ................ 427/248.1 |
| 2010/0055320 | A1 * | 3/2010 | Honma .................... 427/255.28 |
| 2010/0260936 | A1 * | 10/2010 | Kato et al. ............... 427/255.28 |
| 2012/0003396 | A1 * | 1/2012 | Maas et al. .................... 427/569 |
| 2012/0088030 | A1 * | 4/2012 | Kato et al. ................. 427/255.5 |

FOREIGN PATENT DOCUMENTS

JP          2011-018707          1/2011

OTHER PUBLICATIONS

Drewery, J.S., et al., "A rotating substrate platen for use in thin-film deposition systems." J. Phys. E: Sci. Instrum. 22 (1989) 61-62.*
Min, Yo-Sep, et al., "Atomic Layer Deposition of Al2O3 Thin Films from a 1-Methoxy-2-methyl-2-propoxide Complex of Aluminum and Water". Chem. Mater. 2005, 17, 626-631.*

* cited by examiner

*Primary Examiner* — Bret Chen
(74) *Attorney, Agent, or Firm* — IPUSA, PLLC (57) ABSTRACT

A film deposition method includes rotating a rotary table by a first angle while supplying a separation gas from a separation gas supplying part and a first reaction gas from a first gas supplying part; supplying a second reaction gas from a second gas supplying part and rotating the rotary table by a second angle while supplying the separation gas from the separation gas supplying part and the first reaction gas from the first gas supplying part; rotating the rotary table by a third angle while supplying the separation gas from the separation gas supplying part and the first reaction gas from the first gas supplying part; and supplying a third reaction gas from the second gas supplying part and rotating the rotary table by a fourth angle while supplying the separation gas and the first reaction gas.

6 Claims, 7 Drawing Sheets

FILM DEPOSITION METHOD

CROSS-REFERENCE TO RELATED APPLICATION

The present application is based upon and claims the benefit of priority of Japanese Patent Application No. 2012-257651, filed on Nov. 26, 2012, the entire contents of which are incorporated herein by reference.

BACKGROUND OF THE INVENTION

1. Field of the Invention

An aspect of this disclosure relates to a film deposition method, a storage medium, and a film deposition apparatus.

2. Description of the Related Art

There exists a technology where a high dielectric constant material is used for an insulating layer of a memory cell of a semiconductor memory to increase the capacity of the semiconductor memory. Zirconium oxide (ZrO) is an example of a high dielectric constant material. ZrO has a dielectric constant of about 24 to 40, but has a low dielectric strength. Japanese Laid-Open Patent Publication No. 2011-18707 discloses a technology where the dielectric strength of ZrO is improved by adding aluminum (Al) to ZrO.

Meanwhile, there is a trend to increase the diameter of a semiconductor wafer (which is hereafter referred to as a "substrate") to reduce the costs of a semiconductor memory. Here, increasing the diameter of a substrate makes it necessary to improve the uniformity of a film within a surface of the substrate. For this purpose, for example, a film deposition method called an atomic layer deposition (ALD) method (or a molecular layer deposition (MLD) method) is used.

In the ALD method, one (reaction gas A) of two types of reaction gases that react with each other is adsorbed onto a substrate surface, another one (reaction gas B) of the two types of reaction gases is caused to react with the reaction gas A adsorbed onto the substrate surface, and these steps are repeated. Through this process, a reaction product of the reaction gas A and the reaction gas B is generated on the substrate surface, and a thin film made of the reaction product is formed on the substrate surface.

When, for example, the ALD method is performed with a batch-type film deposition apparatus, the reaction gas A is supplied into a process chamber where substrates are placed so that the reaction gas A is adsorbed onto the surfaces of the substrates. Next, the process chamber is evacuated or purged. Then, the reaction gas B is supplied into the process chamber so that the reaction gas A adsorbed onto the surfaces of the substrates reacts with the reaction gas B. As a result, a reaction product is generated on the surfaces of the substrates. The process chamber is evacuated or purged again, and the above process is repeated until a thin film with a desired thickness is formed on each of the substrates.

Thus, when a film deposition process according to the ALD method is performed with a batch-type film deposition apparatus, the film deposition process needs to include steps for supplying and purging the reaction gas A and for supplying and purging the reaction gas B. Accordingly, it generally takes time to form a thin film according to the ALD method using a batch-type film deposition apparatus.

On the other hand, with a rotary-table film deposition apparatus where substrates are placed and processed on a rotary table, it is possible to reduce time necessary for a film deposition process.

In the rotary-table film deposition apparatus, the rotary table is rotated to cause each substrate to sequentially pass through a supply area A where the reaction gas A is supplied, a separation area, and a supply area B where the reaction gas B is supplied. The reaction gas A is adsorbed onto the substrate surface in the supply area A, and is caused to react with the reaction gas B in the supply area B.

Here, with the rotary-table film deposition apparatus, if the cycle of rotation of the rotary table is in synchronization with the timing when the reaction gas A or the reaction gas B is supplied, the amount of the reaction gas A or the reaction gas B adsorbed may vary depending on the substrates. That is, with the rotary-table film deposition apparatus where the reaction gas A or the reaction gas B is supplied directly to one substrate at a time, the controllability of a film deposition process and the uniformity of a thin film on each substrate and the uniformity of thin films on multiple substrates may be reduced.

SUMMARY OF THE INVENTION

An aspect of this disclosure provides a film deposition method performed by a film deposition apparatus that includes a rotary table on which a plurality of substrates are placed, a first gas supplying part disposed in a first process area above the rotary table, a second gas supplying part disposed in a second process area that is above the rotary table and apart from the first process area along a circumferential direction of the rotary table, and a separation gas supplying part disposed in a separation area provided between the first process area and the second process area.

The film deposition method includes a first step of rotating the rotary table by a first angle while supplying a separation gas from the separation gas supplying part and a first reaction gas from the first gas supplying part; a second step of supplying a second reaction gas from the second gas supplying part and rotating the rotary table by a second angle while supplying the separation gas from the separation gas supplying part and the first reaction gas from the first gas supplying part; a third step of rotating the rotary table by a third angle while supplying the separation gas from the separation gas supplying part and the first reaction gas from the first gas supplying part; and a fourth step of supplying a third reaction gas from the second gas supplying part and rotating the rotary table by a fourth angle while supplying the separation gas from the separation gas supplying part and the first reaction gas from the first gas supplying part. The rotation of the rotary table is asynchronous with a gas supply start timing to start supplying the gases from the first gas supplying part and the second gas supplying part.

DESCRIPTION OF THE PREFERRED EMBODIMENTS

A film deposition method and a film deposition apparatus according to preferred embodiments of the present invention are described below with reference to the accompanying drawings. In addition to a film deposition method and a film deposition apparatus described below, the present invention may also be applied to any other method, apparatus, unit, system, and so on for processing surfaces of substrates using multiple gases.

Throughout the accompanying drawings, the same or similar reference numbers are used for the same or similar components, and overlapping descriptions of those components are omitted. Relationships among apparatuses and components are not limited to those illustrated by the drawings. A person having ordinary skill in the art may determine actual relationships among apparatuses and components by referring to the embodiments described below.

Preferred embodiments of the present invention are described in sections 1 through 4 below.
1. CONFIGURATION OF FILM DEPOSITION APPARATUS
2. FILM DEPOSITION METHOD
3. PROGRAM AND STORAGE MEDIUM
4. EXPERIMENTS

1. Configuration of Film Deposition Apparatus

An exemplary configuration of a film deposition apparatus according to an embodiment is described below with reference to FIGS. 1 through 5. The film deposition apparatus of the present embodiment is a rotary-table film deposition apparatus where multiple substrates are placed on a rotary table and two or more types of reaction gases, which react with each other, are supplied alternately to supply areas to process surfaces of the substrates.

Figure 1:
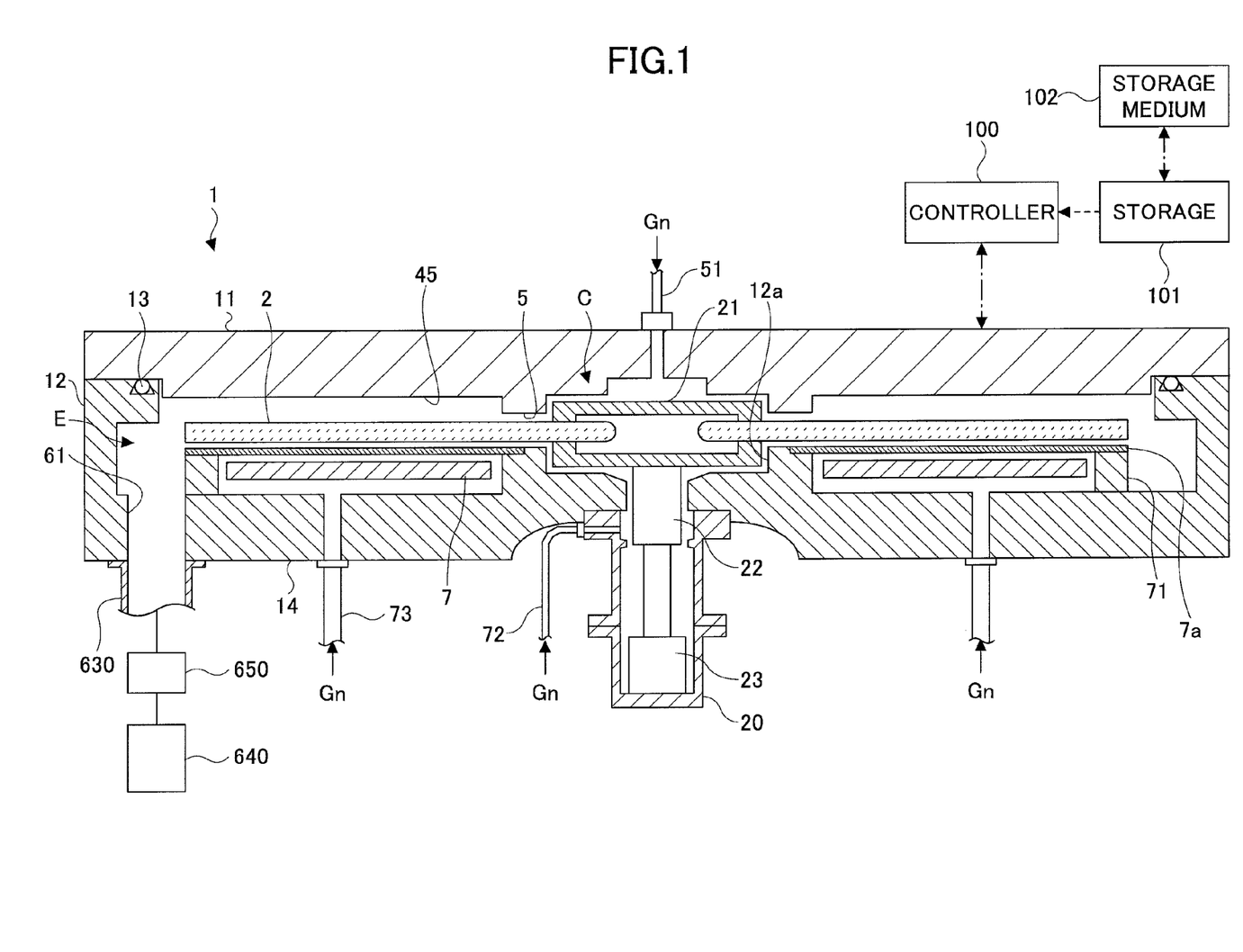
FIG. 1 is a cross-sectional view of an exemplary film deposition apparatus.
Figure 2:
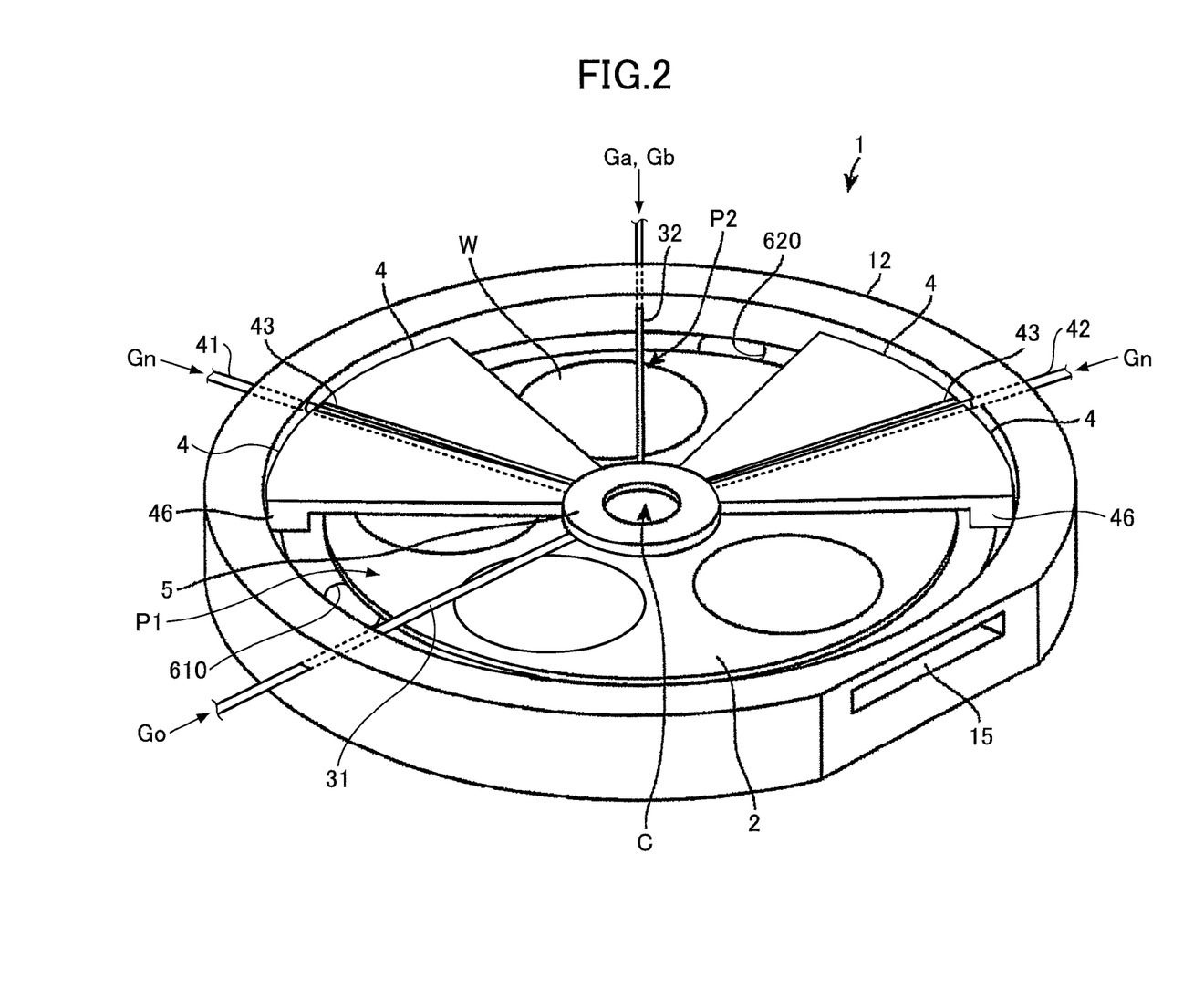
FIG. 2 is a perspective view illustrating an internal configuration of a vacuum chamber of the film deposition apparatus of FIG. 1.
Figure 3:
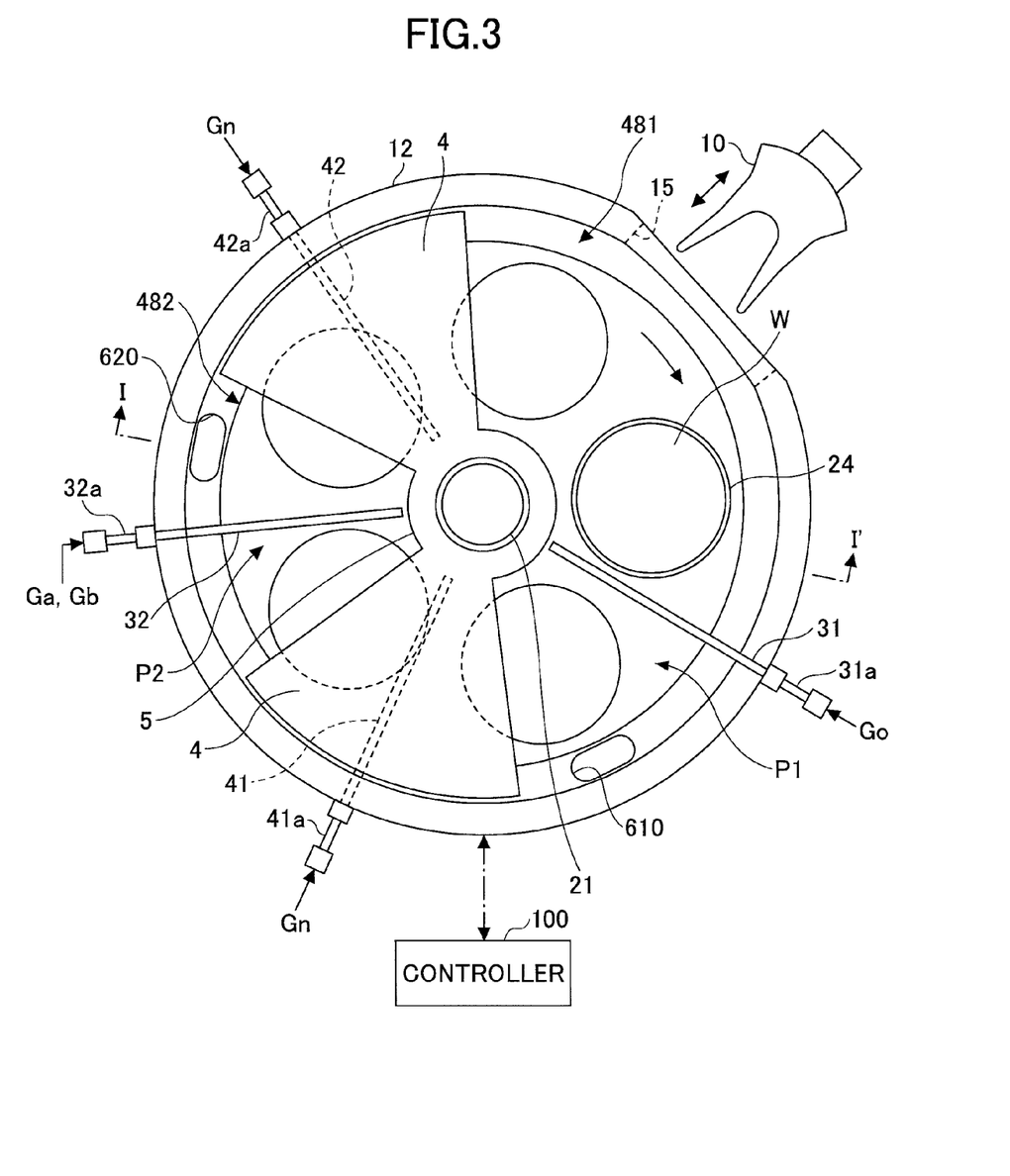
FIG. 3 is a plan view illustrating an internal configuration of the vacuum chamber of the film deposition apparatus of FIG. 1.

FIG. 1 is a cross-sectional view of the film deposition apparatus taken along line I-I' of FIG. 3. FIGS. 2 and 3 are drawings used to describe an exemplary internal structure of a vacuum chamber 1 of the film deposition apparatus. In FIGS. 2 and 3, a top plate 11 is omitted for illustration purposes.

Figure 4:
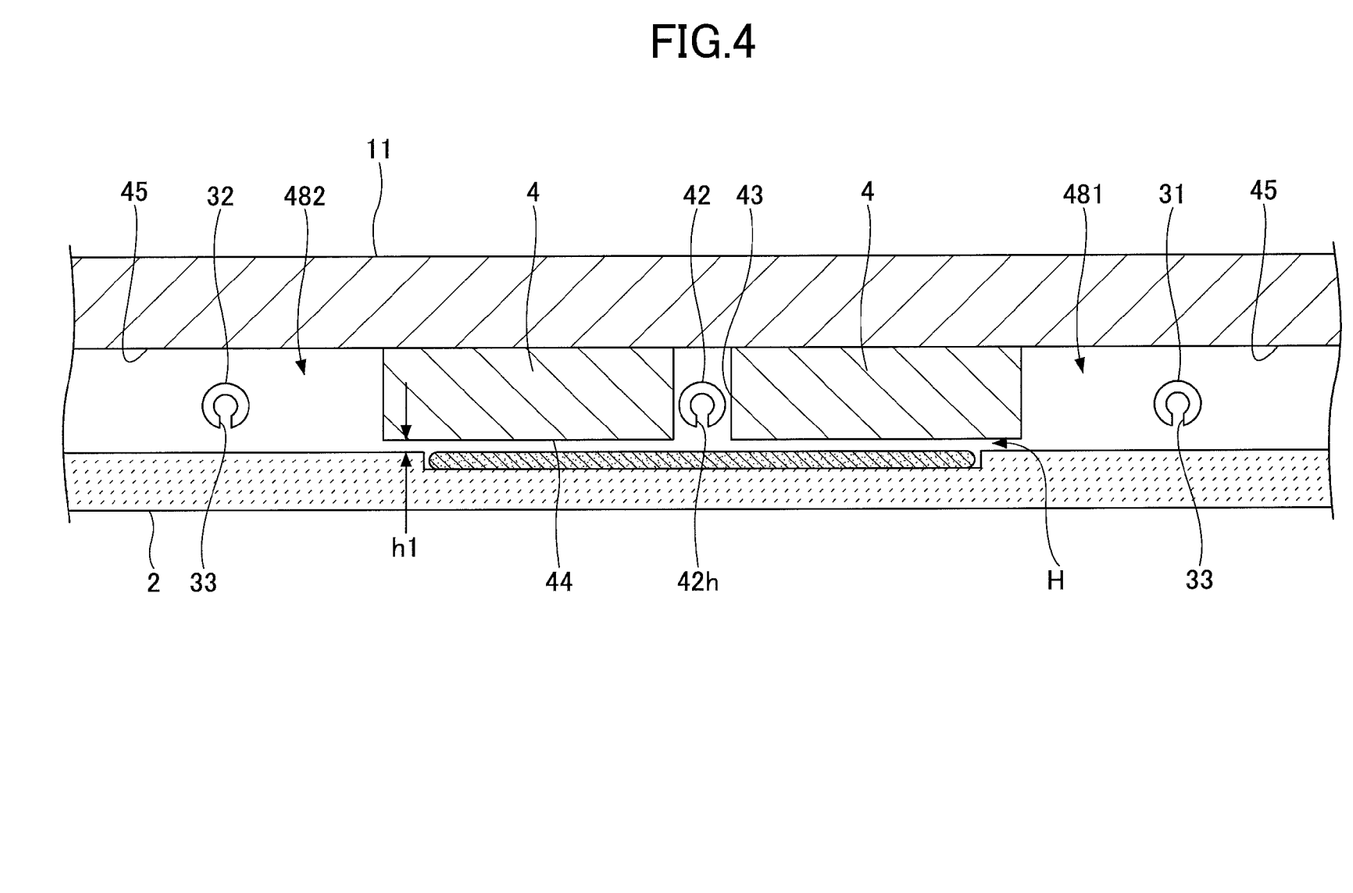
FIG. 4 is a cut-away side view of a part of the film deposition apparatus of FIG. 1.
Figure 5:
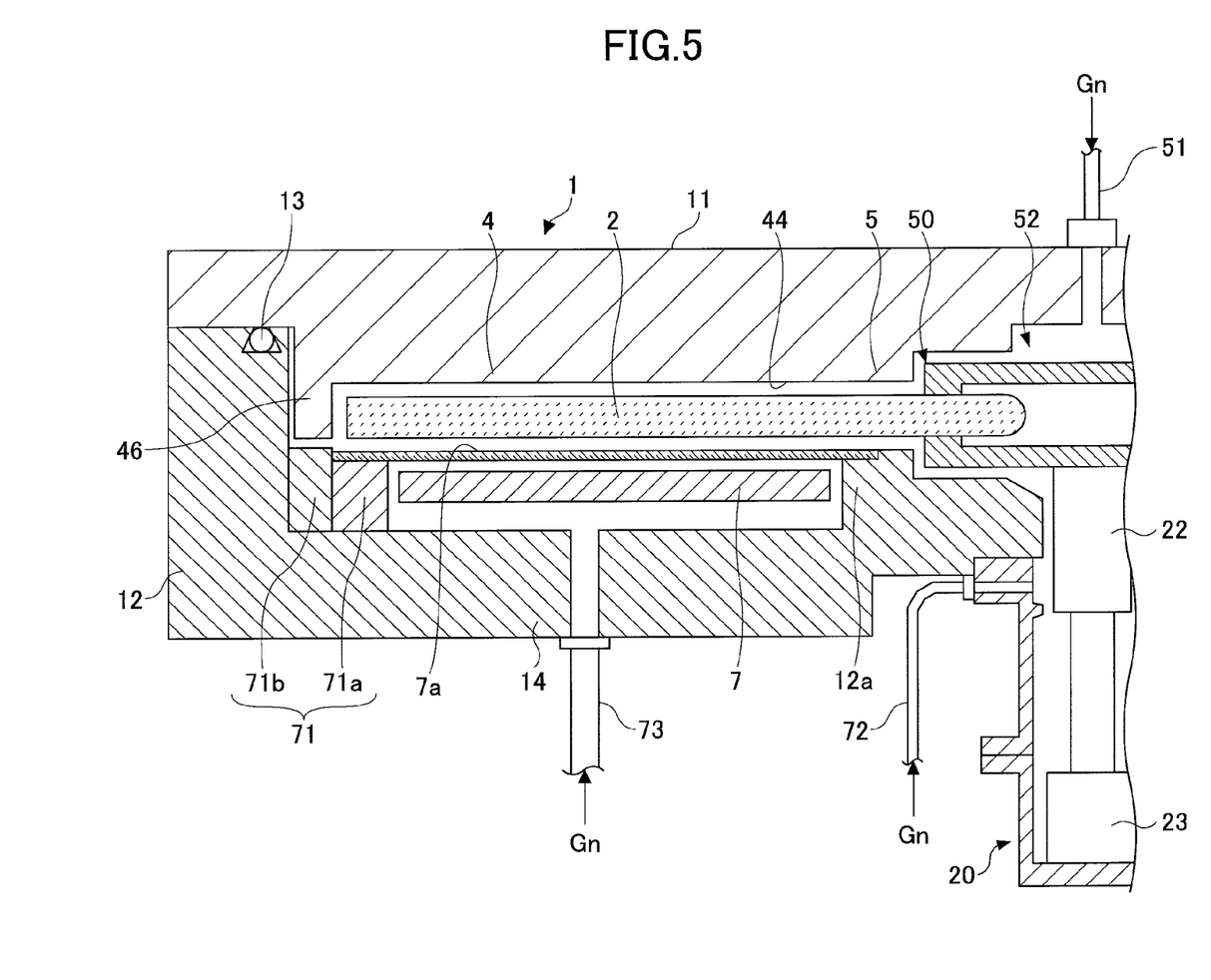
FIG. 5 is a cut-away side view of another part of the film deposition apparatus of FIG. 1.

FIG. 4 is a cross-sectional view of a part of the vacuum chamber 1 from a reaction gas nozzle 31 to a reaction gas nozzle 32 taken along a concentric circle of a rotary table 2. FIG. 5 is a cut-away side view of another part of the film deposition apparatus where a ceiling surface 44 is present.

As illustrated by FIGS. 1 through 3, the film deposition apparatus of the present embodiment may include the vacuum chamber 1 having a substantially circular shape in plan view and a flat shape in side view, the rotary table 2 disposed in the vacuum chamber 1, and a controller (control unit) 100 for controlling operations of the entire film deposition apparatus (e.g., the controller 100 controls the rotational angle of the rotary table 2).

The vacuum chamber 1 may include a chamber body 12 shaped like a closed-end cylinder and a top plate 11 that is placed on the chamber body 12 and detachable from the chamber body 12. The top plate 11 is attached to the chamber body 12 via a sealing part 13 such as an O-ring and hermetically seals the chamber body 12.

The rotary table 2 is fixed to a cylindrical core 21 housed in a case 20 such that the center of the vacuum chamber 1 becomes the center of rotation of the rotary table 2. The upper surface of the rotary table 2 functions as a holding part on which substrates (which are hereafter referred to as "substrates W") are placed.

The case 20 is shaped like a cylinder having an opening at its upper end. A flange at the upper end of the case 20 is hermetically attached to a lower surface of a bottom 14 of the vacuum chamber 1. The case isolates the internal atmosphere of the vacuum chamber 1 from the external atmosphere.

The core 21 is fixed to an upper end of a rotational shaft 22 that extends in the vertical direction. The rotational shaft 22 passes through the bottom 14 of the vacuum chamber 1. A lower end of the rotational shaft 22 is attached to a drive unit 23 that rotates the rotational shaft 22 about a vertical axis. The rotational shaft 22 and the drive unit 23 are housed in the case 20.

As illustrated by FIG. 3, multiple (five in the example of FIG. 3) recesses 24 for holding the substrates W are formed in the upper surface (holding part) of the rotary table 2. The recesses 24 have a substantially circular shape and are arranged along the rotational direction (or the circumferential direction) of the rotary table 2. In FIG. 3, for brevity, only one substrate W placed in one of the recesses 24 is illustrated. The number of substrates W that the rotary table 2 can hold is not limited to five. The rotary table 2 may instead be configured to hold four or less substrates W or six or more substrates W.

Each recess 24 may have an inside diameter (e.g., 304 mm) that is slightly greater than the diameter (e.g., 300 mm) of the substrate W. The depth of the recess 24 may be substantially the same as the thickness of the substrate W. With this configuration, the height of the upper surfaces of the substrates W placed in the recesses 24 become substantially the same as the height of the upper surface (where the substrates W are not placed) of the rotary table 2.

In the film deposition apparatus of the present embodiment, the reaction gas nozzle 31 is a first gas supplying part and is disposed in a first process area above the rotary table 2. The reaction gas nozzle 32 is a second gas supplying part and is disposed in a second process area that is apart from the first process area in the circumferential direction of the rotary table 2. Separation gas nozzles 41 and 42 are separation gas supplying parts and are disposed between the first process area and the second process area. The nozzles 31, 32, 41, and 42 may be composed of quartz.

As illustrated by FIGS. 2 and 3, the reaction gas nozzle 31, the separation gas nozzle 41, the reaction gas nozzle 32, and the separation gas nozzle 42 are arranged clockwise (along the rotational direction of the rotary table 2) in this order from a transfer opening 15 of the vacuum chamber 1 for transferring the substrates W. In other words, the reaction gas nozzle 31, the separation gas nozzle 41, the reaction gas nozzle 32, and the separation gas nozzle 42 are arranged at intervals along the circumferential direction of the vacuum chamber 1. Gas introduction ports 31a, 32a, 41a, and 42a, which are outer ends of the gas nozzles 31, 32, 41, and 42, are fixed to the outer wall of the chamber body 12. The gas nozzles 31, 32, 41, and 42 are inserted through the outer wall of the chamber body 12 into the vacuum chamber 1. In the vacuum chamber 1, the gas nozzles 31, 32, 41, and 42 extend parallel to the upper surface of the rotary table 2 in the radial direction of the chamber body 12 toward the center of rotation of the rotary table 2.

Gas ejection holes (not shown) facing the rotary table 2 are formed in the lower surface of each of the reaction gas nozzles 31 and 32. For example, the gas ejection holes may be arranged at 10-mm intervals in the length direction of the corresponding reaction gas nozzle 31 or 32. An area below the reaction gas nozzle 31 is referred to as a first process area P1 where a second reaction gas Ga or a third reaction gas Gb (e.g., TEMAZ gas or TMA gas) adsorbed onto the substrate W is oxidized. An area below the reaction gas nozzle 32 is referred to as a second process area P2 where the second reaction gas Ga or the third reaction gas Gb (e.g., TEMAZ gas or TMA gas) is adsorbed onto the substrate W.

Thus, the reaction gas nozzle 31 is disposed in the first process area P1 above the rotary table 2. The reaction gas nozzle 31 is connected via a pipe, a valve, and a flow rate controller (e.g., massflow controller) (which are not shown) to a gas supplying source (not shown) for supplying a first reaction gas Go. Thus, the reaction gas nozzle 31 supplies the first reaction gas Go to the upper surface of the rotary table 2.

The reaction gas nozzle 32 is disposed in the second process area P2 above the rotary table 2. The reaction gas nozzle 32 is connected via piping (not shown) to gas supplying sources (not shown) for supplying the second reaction gas Ga and the third reaction gas Gb. Thus, the reaction gas nozzle 32 supplies the second reaction gas Ga and the third reaction gas Gb to the upper surface of the rotary table 2. For example, by complementarily opening and closing valves (not shown), one of the second reaction gas Ga and the third reaction gas Gb is supplied from the reaction gas nozzle 32 into the vacuum chamber 1 (i.e., the second process area 22).

The film deposition apparatus may be configured to also supply an inert gas from the reaction gas nozzle 32 to the second process area P2 (i.e., an area on the upper surface of the rotary table 2). Also, the film deposition apparatus may include two or more reaction gas nozzles 32 that supply the second reaction gas Ga, the third reaction gas Gb, and the inert gas, respectively.

The separation gas nozzles 41 and 42 are disposed between the first process area P1 and the second process area P2. The separation gas nozzles 41 and 42 are connected via piping (not shown) to gas supplying sources (not shown) for supplying a separation gas Gn. Thus, the separation gas nozzles 41 and 42 supply the separation gas Gn to the upper surface of the rotary table 2.

In the present embodiment, the film deposition apparatus uses an oxygen-containing gas as the first reaction gas Go. Examples of the oxygen-containing gas include an oxygen gas and an ozone gas. The reaction gas (the first reaction gas Go) supplied from the reaction gas nozzle 31 is used to oxidize the reaction gases (the second reaction gas Ga and the third reaction gas Gb) that are supplied from the reaction gas nozzle 32 and adsorbed onto the substrate W, and thereby generate an oxide (such as ZrO or AlO).

In the present embodiment, the film deposition apparatus uses, for example, a zirconium-containing gas (or vapor) containing zirconium (Zr) as the second reaction gas Ga. The zirconium-containing gas is, for example, an organic metal gas including zirconium.

In the present embodiment, the film deposition apparatus uses an aluminum-containing gas containing aluminum (Al) as the third reaction gas Gb. The aluminum-containing gas is, for example, an organic metal gas including aluminum.

In the present embodiment, the film deposition apparatus uses an inert gas as the separation gas Gn. Examples of the inert gas include an argon (Ar) gas, a helium gas, and a nitrogen gas.

Although examples of gases used by the film deposition apparatus of the present embodiment are described above, the film deposition apparatus may also use any other gases depending on the composition of a reaction product to be generated.

As illustrated by FIGS. 2 and 3, multiple (in this example, two) protruding parts 4 are provided in the vacuum chamber 1 of the film deposition apparatus. In plan view, each protruding part 4 is shaped like a fan whose top part is cut off to form an arc (inner arc). In the present embodiment, the inner arc of the protruding part 4 is connected to a protrusion 5. The protruding part 4 is disposed such that its outer arc (which is at an end of the protruding part 4 opposite to the inner arc) becomes substantially parallel to the inner circumferential surface of the chamber body 12 of the vacuum chamber 1.

More specifically, as illustrated by FIG. 4, the protruding parts 4 are attached to the lower surface of the top plate 11. The protruding part 4 includes a flat lower surface that is referred to as a ceiling surface 44 (first ceiling surface). Parts of the lower surface of the top plate 11 on both sides of the ceiling surface 44 in the circumferential direction are referred to as ceiling surfaces 45 (second ceiling surfaces). The ceiling surfaces 45 are higher than the ceiling surface 44. With this configuration, a narrow separation space(s) H and spaces 481 and 482, into which gas flows from the separation space H, are formed in the vacuum chamber 1. Thus, the protruding parts 4 form narrow separation spaces H that function as separation areas D illustrated in FIG. 6.

Also, as illustrated by FIG. 4, a groove 43 is formed in the middle in the circumferential direction of the protruding part 4. The groove 43 extends in the radial direction of the rotary table 2. The separation gas nozzle 42 is placed in the groove 43 of one of the protruding parts 4, and the separation gas nozzle 41 is placed in the groove 43 of the other one of the protruding parts 4.

In FIG. 4, reference number 42h indicates gas ejection holes formed in the separation gas nozzle 42. The gas ejection holes 42h are arranged at predetermined intervals (e.g., 10-mm intervals) in the length direction of the reaction gas nozzle 42. The opening diameter of each gas ejection hole 42h is, for example, from about 0.3 mm to about 1.0 mm. Although not illustrated in FIG. 4, gas ejection holes are also formed in the separation gas nozzle 41 in a similar manner.

Also in FIG. 4, the reaction gas nozzles 31 and 32 are disposed below the ceiling surfaces 45. The reaction gas nozzles 31 and 32 are positioned apart from the ceiling surfaces 45 and close to the substrate W or the upper surface of the rotary table 2. The reaction gas nozzle 31 is disposed in the space 481 below the ceiling surface 45. The reaction gas nozzle 32 is disposed in the space 482 below the ceiling surface 45.

The narrow separation space H is formed between the ceiling surface 44 and the upper surface of the rotary table 2. When an inert gas (e.g., $N_2$ gas) is supplied from the separation gas nozzle 42, the inert gas flows through the separation space H into the spaces 481 and 482. Because the volume of the separation space H is less than the volumes of the spaces 481 and 482, the pressure in the separation space H where the inert gas is supplied becomes higher than the pressures in the spaces 481 and 482. Thus, the separation space H provides a pressure barrier between the spaces 481 and 482.

Also, the flow of the inert gas from the separation space H into the spaces 481 and 482 function as a counter flow to the first reaction gas Go in the first process area P1 and the second and third reaction gases Ga and Gb in the second process area P2. Thus, the film deposition apparatus of the present embodiment is configured such that the first reaction gas in the first process area P1 is separated from the second and third reaction gases in the second process area P2 by the separation space H. In other words, the film deposition apparatus is configured to prevent the first reaction gas from mixing and reacting with the second and third reaction gases in the vacuum chamber 1.

A height h1 of the ceiling surface 44 from the upper surface of the rotary table 2 may be determined based on the pressure in the vacuum chamber during a film forming process, the rotational speed of the rotary table 2, and/or the amount of the separation gas ($N_2$ gas) supplied so that the pressure in the separation space H becomes higher than the pressures in the spaces 481 and 482. The height h1 of the ceiling surface 44 from the upper surface of the rotary table 2 may also be determined based on the specifications of the film deposition apparatus and types of gases used. Further, the height h1 of the ceiling surface 44 from the upper surface of the rotary table 2 may be determined in advance by experiments or calculations.

As illustrated by FIGS. 1 through 3, the protrusion 5 is formed on the lower surface of the top plate 11 to surround the core 21 to which the rotary table 2 is fixed. The protrusion 5 is connected to the center-side ends (inner arcs) of the protruding parts 4. The lower surface of the protrusion 5 is at the same height as the ceiling surface 44.

Referring to FIG. 5, an L-shaped bent part 46 is formed at the outer end of the protruding part 4 (i.e., an end that is closer to the inner circumferential surface of the vacuum chamber 1). The bent part 46 faces the outer end face of the rotary table 2. The bent part 46 prevents gases from flowing between the space 481 and the space 482 through a gap between the rotary table 2 and the inner circumferential surface of the chamber body 12. The protruding part(s) 4 is attached to or formed on the lower surface of the top plate 11.

A small gap is provided between the outer surface of the bent part 46 and the chamber body 12 so that the top plate 11 can be detached from the chamber body 12. For example, the gap between the inner surface of the bent part 46 and the outer end face of the rotary table 2 and the gap between the outer surface of the bent part 46 and the chamber body 12 may be set at a value that is substantially the same as the height of the ceiling surface 44 from the upper surface of the rotational table 2.

Referring to FIG. 3 again, a first evacuation port 610 communicating with the space 481 (FIG. 4) and a second evacuation port 620 communicating with the space 482 (FIG. 4) are formed between the rotary table 2 and the inner circumferential surface of the chamber body 12. As illustrated by FIG. 1, each of the first evacuation port 610 and the second evacuation port 620 is connected via an evacuation pipe 630 and a pressure controller 650 to a vacuum pump 640 that is an evacuation unit.

As illustrated by FIGS. 1 and 5, a heater unit 7 is provided in a space between the rotary table 2 and the bottom 14 of the vacuum chamber 1. The heater unit 7 heats, via the rotary table 2, the substrates W on the rotary table 2 to a temperature (e.g., 450° C.) defined by a process recipe. A ring-shaped cover part 71 is provided below the outer periphery of the rotary table 2. The cover part 71 prevents entry of gases into a space below the rotary table 2.

As illustrated by FIG. 5, the cover part 71 includes an inner part 71a and an outer part 71b. The inner part 71a is provided below the rotary table 2 and spans an area that corresponds to the outer periphery of the rotary table 2 and a narrow space surrounding the outer circumference of the rotary table 2. The outer part 71b is provided between the inner part 71a and the inner circumferential surface of the vacuum chamber 1. The outer part 71b is disposed below the bent part 46 formed at the outer end of the protruding part 4 such that a small gap is formed between the outer part 71b and the lower end of the bent part 46. The inner part 71a surrounds the heater unit 7.

The controller (control unit) 100 sends commands (or signals) to other components of the film deposition apparatus and thereby controls the components. The controller 100 may be implemented by a computer or an arithmetic processing unit for controlling operations of the entire film deposition apparatus. For example, the controller 100 executes a program stored in a storage 101 to control hardware components of the film deposition apparatus and thereby form thin films on the substrates W. The controller 100 may include a central processing unit (CPU) and a memory (e.g., ROM or RAM).

The memory of the controller 100 may store a program for causing the film deposition apparatus (or the CPU) to perform a film deposition method described later. The program may include code units corresponding to steps to be performed in the film deposition method. The controller 100 reads the program from a storage medium 102 (e.g., a hard disk, a compact disk, a magneto-optical disk, a memory card, or a flexible disk), stores the program in the storage 101, and installs or loads the program into the controller 100.

In the present embodiment, the controller 100 controls operations of the reaction gas nozzle 31 (first gas supplying part) for supplying the first reaction gas Co to the upper surface of the rotary table 2. The controller 100 also controls operations of the reaction gas nozzle 32 (second gas supplying part) for supplying the second reaction gas Ga and the third reaction gas Gb to the upper surface of the rotary table 2. The controller 100 also controls operations of the separation gas nozzles 41 and 42 (separation gas supplying parts) for supplying the separation gas Gn to the upper surface of the rotary table 2. The film deposition apparatus may be configured to also supply an inert gas from the reaction gas nozzle 32 to the second process area P2 to purge the second process area P2.

The controller 100 further controls the rotational angle of the rotary table 2. For example, at a first step, the controller 100 causes the rotary table 2 to rotate by a first angle $\theta 1$. At a second step, the controller 100 causes the rotary table 2 to rotate by a second angle $\theta 2$. At a third step, the controller 100 causes the rotary table 2 to rotate by a third angle $\theta 3$. At a fourth step, the controller 100 causes the rotary table 2 to rotate by a fourth angle $\theta 4$.

2. Film Deposition Method

Figure 6:
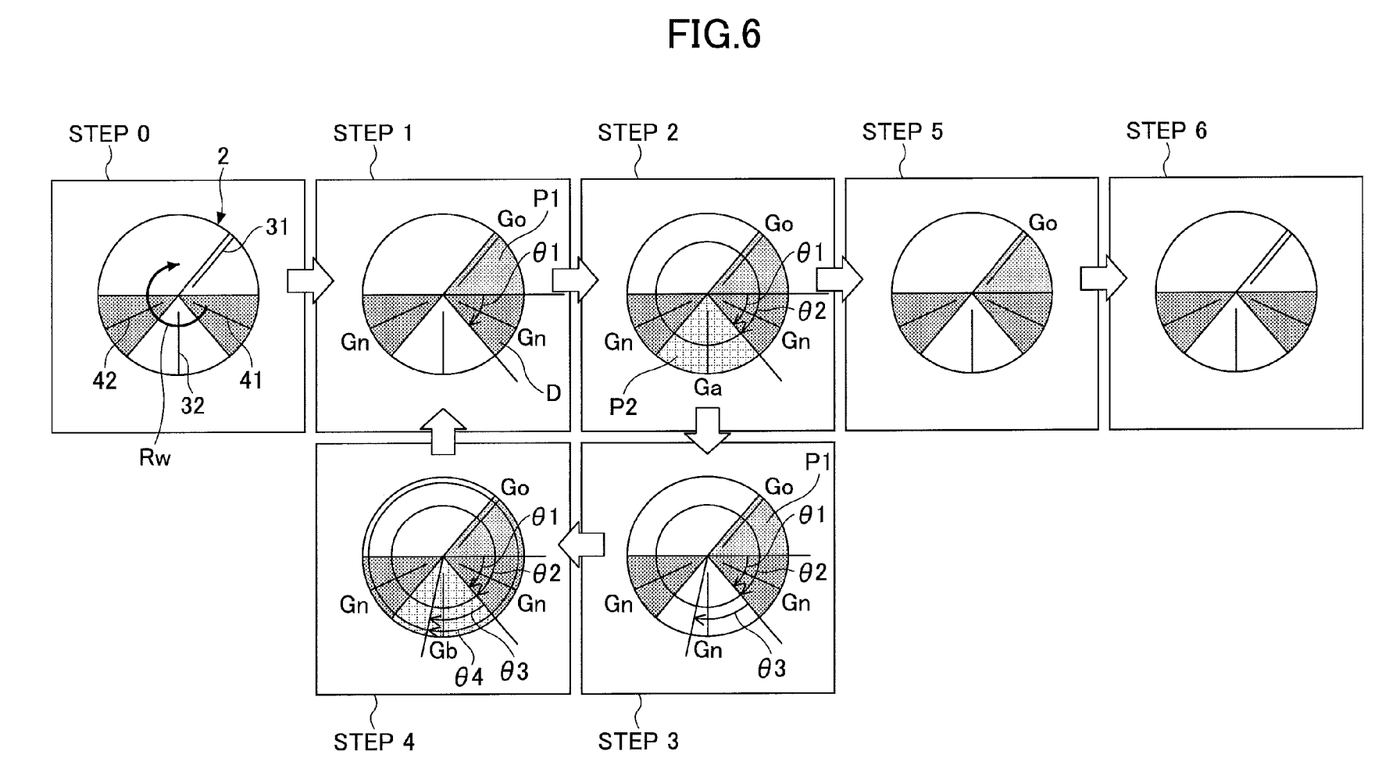
FIG. 6 is a drawing used to describe an exemplary film deposition method.

An exemplary film deposition method performed by the film deposition apparatus of the present embodiment is described below with reference to FIGS. 1 through 6. FIG. 6 is a drawing used to describe an exemplary film deposition method.

In the present embodiment, the controller 100 controls the rotary table 2 such that the rotation of the rotary table 2 becomes asynchronous with a gas supply start timing at which the supply of gases from the reaction gas nozzle 31 (first gas supplying part) and the reaction gas nozzle 32 (second gas supplying part) is started (or a timing for controlling the start of the supply of the gases from the nozzles 31 and 32). For example, the controller 100 makes the rotation of the rotary table 2 asynchronous with the gas supply start timing by controlling the rotary table 2 such that the sum of the first angle $\theta 1$, the second angle $\theta 2$, the third angle $\theta 3$, and the fourth angle $\theta 4$ does not become an integral multiple of 360 degrees.

Also, the controller 100 may be configured to rotate the rotary table 2 by a degree (e.g., 60 degrees) that is greater than or equal to the minimum angle necessary to oxidize the surface of the substrate W at a first oxidation step (step 1 in FIG. 6) before the second reaction gas Ga is supplied at a first reaction step (step 2 in FIG. 6). Similarly, the controller 100 may be configured to rotate the rotary table 2 by a degree (e.g., 60 degrees) that is greater than or equal to the minimum angle necessary to oxidize the surface of the substrate W at a second oxidation step (step 3 in FIG. 6) before the third reaction gas Gb is supplied at a second reaction step (step 4 in FIG. 6). In other words, the controller 100 may be configured to make the rotation of the rotary table 2 asynchronous with the gas supply start timing by controlling the rotary table 2 such that the sum of the first angle θ1 and the third angle θ3 becomes greater than or equal to 60 degrees and less than 360 degrees or becomes greater than 360 degrees. The minimum angle may be determined based on the size of each substrate W and/or the number of substrates W to be placed on the rotary table 2. Also, the minimum angle may be determined by experiments or calculations.

Further, the controller 100 may be configured to make the rotation of the rotary table 2 asynchronous with a gas supply cycle (a cycle from step 1 through step 4 in FIG. 6) of the reaction gas nozzles 31 and 32 by controlling the rotary table 2 such that the sum of the first angle θ1 and the third angle θ3 becomes 60 degrees and the sum of the second angle θ2 and the fourth angle θ4 becomes 360 degrees.

(Carry-In Step)

The film deposition apparatus of the present embodiment opens a gate valve (not shown), and causes a transfer arm 10 (FIG. 3) to carry the substrate W via the transfer opening 15 into the vacuum chamber 1 and place the substrate W in the recess 24 of the rotary table 2. The film deposition apparatus may include lift pins (not shown) used to transfer the substrate W from the transfer arm 10 to the recess 24. The lift pins move up and down via through holes formed in the bottom of the recess 24 when the recess 24 stops at a position facing the transfer opening 15. The film deposition apparatus (or the controller 100) intermittently rotates the rotary table 2 and places the substrate W in each of multiple (in this example, five) recesses 24 of the rotary table 2.

(Preparation Step: Step 0 of FIG. 6)

The film deposition apparatus closes the gate valve, evacuates the vacuum chamber 1 to the lowest ultimate vacuum by using the vacuum pump 640, and causes the separation gas nozzles 41 and 42 to supply the separation gas Gn (e.g., an inert gas). At the same time, the film deposition apparatus also causes a separation gas supply tube 51 and purge gas supply tubes 72 (FIG. 1) to supply an inert gas at a predetermined flow rate. Through this step and with the pressure controller 650, the film deposition apparatus can adjust the pressure in the vacuum chamber 1 to a predetermined process pressure.

Next, the film deposition apparatus heats the substrates W with the heater unit 7 while rotating the rotary table 2 in a clockwise direction Rw.

(First Oxidation Step: Step 1 of FIG. 6)

At a first oxidation step (or a first step), the film deposition apparatus causes the reaction gas nozzle 31 to supply the first reaction gas Go (e.g., an oxygen-containing gas) while causing the separation gas nozzles 41 and 42 to supply the separation gas Gn. Also, the controller 100 of the film deposition apparatus causes the rotary table 2 to rotate by the first angle θ1. During this step, a surface (e.g., the uppermost surface) of the substrate W (i.e., one of the substrates W) passing through the first process area P1 is oxidized. The first oxidation step is also performed after step 4 of FIG. 6 as a preparation step (e.g., to oxidize the uppermost surface of a reaction product) for step 2 where the second reaction gas Ga is supplied.

According to the present embodiment, the controller 100 causes the rotary table 2 to rotate by 60 degrees (the first angle θ1) at step 1 (first step) of FIG. 6. Thus, the surface of the substrate W is oxidized at the first step before being placed in the second process area P2 at a second step (step 2 of FIG. 6).

(First Reaction Step: Step 2 of FIG. 6)

At a first reaction step (or a second step), the film deposition apparatus causes the reaction gas nozzle 32 to supply the second reaction gas Ga (e.g., a Zr-containing gas) while causing the separation gas nozzles 41 and 42 to supply the separation gas Gn and causing the reaction gas nozzle 31 to supply the first reaction gas Go. Also, the controller 100 of the film deposition apparatus causes the rotary table 2 to rotate by the second angle θ2. During this step, the second reaction gas Ga is adsorbed onto a surface (e.g., the uppermost surface) of the substrate W in the second process area 22. Also during this step, the surface of the substrate W onto which the second reaction gas Ga has been adsorbed is oxidized in the first process area P1. Thus, through the second step, an oxide (e.g., a ZrO film) of the second reaction gas Ga is deposited (or formed) on the substrate W.

According to the present embodiment, the controller 100 causes the rotary table 2 to rotate by 360 degrees (the second angle θ2) at step 2 (second step) of FIG. 6.

Here, the separation gas Gn, the first reaction gas Go, and the second reaction gas Ga are separated from each other by the separation areas D and therefore hardly mix with each other in the vacuum chamber 1.

(Second Oxidation Step: Step 3 of FIG. 6)

At a second oxidation step (or a third step), the film deposition apparatus causes the reaction gas nozzle 32 to supply the inert gas Gn while causing the separation gas nozzles 41 and 42 to supply the separation gas Gn and causing the reaction gas nozzle 31 to supply the first reaction gas Go. Also, the controller 100 of the film deposition apparatus causes the rotary table 2 to rotate by the third angle θ3. Thus, during this step, the second process area P2 where the second reaction gas Ga has been supplied is purged with the inert gas Gn. Also during this step, the surface of the substrate W (e.g., the surface of the substrate W onto which the second reaction gas Ga has been adsorbed at step 2) is oxidized in the first process area P1.

According to the present embodiment, the controller 100 causes the rotary table 3 to rotate by 60 degrees (the third angle θ3) at step 3 (third step) of FIG. 6. Thus, the surface of the substrate W is oxidized at the third step before being placed in the second process area P2 at a fourth step (step 4 of FIG. 6).

(Second Reaction Step: Step 4 of FIG. 6)

At a second reaction step (or a fourth step), the film deposition apparatus causes the reaction gas nozzle 32 to supply the third reaction gas Gb (e.g., an Al-containing gas) while causing the separation gas nozzles 41 and 42 to supply the separation gas Gn and causing the reaction gas nozzle 31 to supply the first reaction gas Go. Also, the controller 100 of the film deposition apparatus causes the rotary table 2 to rotate by the fourth angle θ4. During this step, the third reaction gas Gb is adsorbed onto a surface of the substrate W (e.g., the surface of the substrate W that is oxidized in step 3) in the second process area P2. Also during this step, the surface of the substrate W onto which the third reaction gas Gb has been adsorbed is oxidized in the first process area P1. Thus, through the fourth step, an oxide (e.g., an AlO film) of the third reaction gas Gb is deposited (or formed) on the substrate W.

According to the present embodiment, the controller 100 causes the rotary table 4 to rotate by 360 degrees (the fourth angle θ4) at step 4 (fourth step) of FIG. 6.

Here, the separation gas Gn, the first reaction gas Go, and the third reaction gas Gb are separated from each other by the separation areas D and therefore hardly mix with each other in the vacuum chamber 1.

Then, the film deposition apparatus returns to the first oxidation step (step 1 of FIG. 6), and repeats steps 1 through 4 until a thin film of a reaction product formed on the substrate W reaches a desired thickness. In other words, the film deposition apparatus forms layers of oxide on the substrate W until the thin film of the reaction product reaches a desired thickness. The film deposition apparatus (or the controller 100) causes the rotary table 2 to rotate at steps 1 through 4 such that the sum of the first angle θ1, the second angle θ2, the third angle θ3, and the fourth angle θ4 does not become an integral multiple of 360 degrees. This configuration enables the film deposition apparatus to make the rotation of the rotary table 2 asynchronous with a gas supply start timing to start supplying gases from the reaction gas nozzle 31 (first gas supplying part) and the reaction gas nozzle 32 (second gas supplying part).

When the process returns to step 1 of FIG. 6, the film deposition apparatus causes the reaction gas nozzle 32 to supply the inert gas Gn to purge the second process area P2.
(Third Oxidation Step: Step 5 of FIG. 6)

At a third oxidation step, the film deposition apparatus causes the reaction gas nozzle 31 to supply the first reaction gas Go (e.g., an oxygen-containing gas) while causing the separation gas nozzles 41 and 42 to supply the separation gas Gn. With this step, a surface (e.g., the uppermost surface) of the substrate W on which a thin film has been formed is oxidized.
(Carry-Out Step: Step 6 of FIG. 6)

The film deposition apparatus opens the gate valve (not shown), and causes the transfer arm 10 (FIG. 3) to carry the substrate W, On which a thin film is formed, via the transfer opening 15 out of the vacuum chamber 1. Similarly to the carry-in step, the lift pins may be used to transfer the substrate W from the recess 24 to the transfer arm 10.

As described above, the film deposition method of the present embodiment makes it possible to supply two or more types of reaction gases asynchronously with the rotation of a rotary table of a film deposition apparatus. According to the present embodiment, the controller 100 makes the rotation of the rotary table 2 asynchronous with the gas supply start timing of the reaction gas nozzles 31 and 32 by controlling the rotary table 2 such that the sum of the first angle θ1, the second angle θ2, the third angle θ3, and the fourth angle θ4 does not become an integral multiple of 360 degrees. In other words, when a thin film is formed by repeating a cycle of step 1 through step 4 described above, the film deposition method of the present embodiment makes it possible to change, cycle by cycle, a position on the substrate W where the supply of gas is started. This in turn makes it possible to uniformly supply reaction gases to multiple substrates. Also with the film deposition method of the present embodiment where the rotation of the rotary table 2 is made asynchronous with the gas supply start timing of the reaction gas nozzles 31 and 32, it is possible to improve the controllability of a film deposition process and improve the uniformity of a thin film on each substrate and the uniformity of thin films on multiple substrates.

According to the film deposition method of the present embodiment, the second reaction gas Ga (e.g., a ZrO film) is adsorbed onto the substrate W in the first reaction step, and about one molecular layer of the third reaction gas Gb (e.g., AlO) is caused to react with the second reaction gas Ga in the second reaction step. This in turn makes it possible to form a desired reaction product on the substrate W. With the film deposition method of the present embodiment where about one molecular layer of the third reaction gas Gb is caused to react, in the second reaction step, with the second reaction gas Ga adsorbed in the first reaction step, it is possible to form a multilayer film (e.g., a multilayer Al-doped ZrO film) composed of different layers stacked at intervals on the substrate W by repeating the steps.

3. Program And Storage Medium

The present invention may also be implemented as a program Pr that causes a computer of a film deposition apparatus to perform the above film deposition method. The program Pr may be stored in a non-transitory computer-readable storage medium Md. Examples of the computer-readable storage medium Md may include a flexible disk (FD), a compact disk read-only memory (CD-ROM), a CD recordable (CD-R), a digital versatile disk (DVD), a tape drive, semiconductor memories such as a flash memory, a random access memory (RAM), and a ROM, a memory card, and a hard disk drive (HDD).

The program Pr may also be stored in the storage 101 (FIG. 1) of the film deposition apparatus. The storage medium 102 of FIG. 1 is also an example of the storage medium Md.

4. Experiments

Experiments were performed to evaluate the effects of the above embodiment. In the experiments, an ozone ($O_3$) gas was used as the first reaction gas Go, a tetrakis(ethylmethylamino)zirconium (TEMAZ) gas was used as the second reaction gas Ga, a trimethylaluminum (TMA) gas was used as the third reaction gas Gb, and a nitrogen ($N_2$) gas was used as the separation gas Gn. Thus, in the experiments, a Zr/Al film was formed. The film deposition apparatus of the present embodiment can form an oxide film, a nitride film, and any other film by depositing a reaction product generated by causing two or more types of gases to react with each other.
(Configuration of Film Deposition Apparatus and Film Deposition Method Used in Experiments)

The configuration of a film deposition apparatus and a film deposition method used in the experiments are substantially the same as those described above with reference to FIGS. 1 through 6. In the experiments, the rotary table 2 was rotated at a rotational speed from 3 rpm to 6 rpm. However, the rotary table 2 of the film deposition apparatus of the present embodiment may also be rotated at a rotational speed that is not in the range from 3 rpm to 6 rpm.
(Preparation Step: Step 0 of FIG. 6)

The gate valve was closed and the vacuum chamber 1 was evacuated to the lowest ultimate vacuum by using the vacuum pump 640. Then, the $N_2$ gas (the separation gas Gn) was supplied at a predetermined flow rate from the separation gas nozzles 41 and 42. The $N_2$ gas was also supplied at a predetermined flow rate from the separation gas supply tube 51 and the purge gas supply tubes 72 (FIG. 1). With the pressure controller 650, the pressure in the vacuum chamber 1 was adjusted to a predetermined process pressure.

Next, the substrates W were heated with the heater unit 7 while rotating the rotary table 2 in the clockwise direction Rw. The substrates W were heated to a temperature range between 250° C. and 350° C.

(First Oxidation Step: Step 1 of FIG. 6)

At the first oxidation step (or the first step), the $O_3$ gas (the first reaction gas Go) was supplied from the reaction gas nozzle 31 while supplying the $N_2$ gas from the separation gas nozzles 41 and 42. Also, the rotary table 2 was rotated by 60 degrees (the first angle θ1). As a result, the surface of the substrate W that passed through the first process area 21 was uniformly oxidized.

(First Reaction Step: Step 2 of FIG. 6)

At the first reaction step (or the second step), the TEMAZ gas (the second reaction gas Ga) was supplied from the reaction gas nozzle 32 while supplying the $N_2$ gas from the separation gas nozzles 41 and 42 and supplying the $O_3$ gas from the reaction gas nozzle 31. Also, the rotary table 2 was rotated by 360 degrees (the second angle θ2). As a result, the TEMAZ gas was adsorbed onto the surface of the substrate W that passed through the second process area P2. Also during this step, the substrate W onto which the TEMAZ gas was adsorbed was caused to pass through the first process area P1 to oxidize the TEMAZ gas with the $O_3$ gas and as a result, a ZrO film was formed (or deposited) on the surface of the substrate W. In this step, about one molecular layer of the TEMAZ gas (a ZrO film) was adsorbed onto (or formed on) the entire surface of the substrate W.

Here, in the temperature range of the substrate W described above, the TEMAZ gas is adsorbed onto the surface of the substrate W in a self-limited manner. That is, the TEMAZ gas is adsorbed onto the surface of the substrate W, but is hardly adsorbed onto the TEMAZ gas that has already been adsorbed onto the surface of the substrate W. Also, the TEMAZ gas is not thermally decomposed on the surface of the substrate W. For this reason, even if the substrate W is caused to pass through the second process area P2 multiple times, the entire surface of the substrate W is covered by about one molecular layer of the TEMAZ gas.

(Second Oxidation Step: Step 3 of FIG. 6)

At the second oxidation step (or the third step), the $N_2$ gas was supplied from the reaction gas nozzle 32 while supplying the $N_2$ gas from the separation gas nozzles 41 and 42 and supplying the $O_3$ gas from the reaction gas nozzle 31. With this step, the second process area P2 where the TEMAZ gas had been supplied was purged with the $N_2$ gas. Also in this step, the substrate W onto which the TEMAZ gas was adsorbed was caused to pass through the first process area P1 to oxidize the TEMAZ gas with the $O_3$ gas and as a result, a ZrO film was formed (or deposited) on the surface of the substrate W.

In this step, the rotary table 2 was rotated by "360−18" degrees or "360+18" degrees (the third angle θ3) to make the cycle of rotation of the rotary table 2 asynchronous with the timing of supplying the $O_3$ gas.

(Second Reaction Step: Step 4 of FIG. 6)

At the second reaction step (or the fourth step), the TMA gas (the third reaction gas Gb) was supplied from the reaction gas nozzle 32 while supplying the $N_2$ gas from the separation gas nozzles 41 and 42 and supplying the $O_3$ gas from the reaction gas nozzle 31. Also, the rotary table 2 was rotated by 360 degrees (the fourth angle θ4). As a result, the TMA gas was adsorbed onto the surface (the ZrO film) of the substrate W that passed through the second process area P2. Also in this step, the substrate W onto which the TMA gas was adsorbed was caused to pass through the first process area P1 to oxidize the TMA gas with the $O_3$ gas and as a result, an AlO film was formed (or deposited) on the surface of the substrate W. In this step, about one molecular layer of the TMA gas (an AlO film) was adsorbed onto (or formed on) the entire surface of the substrate W.

Then, steps 1 through 4 were repeated until a thin film of a reaction product (the ZrO film and the AlO film) formed on the substrate W reached a desired thickness.

When the process returned from step 4 to step of FIG. 6, the inert gas Gn was supplied from the reaction gas nozzle 32 to purge the second process area P2. Here, after returning from step 4 to step 1, the film deposition apparatus may be configured to rotate the rotary table 2 by "360−18" degrees or "360+18" degrees (the first angle θ1) to make the cycle of rotation of the rotary table 2 asynchronous with the timing of repeating step 1 through step 4 of FIG. 6.

(Experiment 1)

Figure 7:
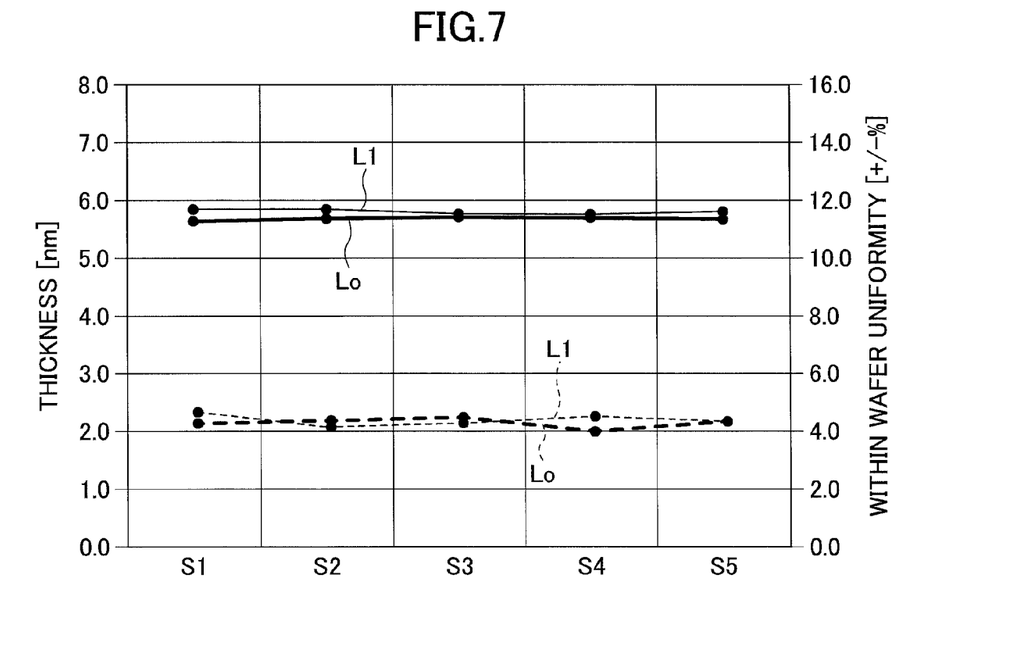
FIG. 7 is a graph illustrating results of an experiment.

FIG. 7 is graph illustrating results of an experiment 1 performed to evaluate the effects of the film deposition method of the present embodiment. In the experiment 1, the controllability of a film deposition process where the rotation of the rotary table 2 was made asynchronous with the gas supply start timing of the reaction gas nozzle 32 (the second gas supplying part) was evaluated.

The horizontal axis of FIG. 7 indicates substrates W (S1 through S5) placed in the recesses 24 of the rotary table 2. In FIG. 7, solid lines represent film thicknesses indicated by the left vertical axis. In FIG. 7, dotted lines represent variation of film thickness (within the same substrate) indicated by the right vertical axis. In the experiment 1, a Rutherford back scattering (RBS) method was used to measure the film thickness.

Also in the experiment 1, the rotary table 2 was rotated by "360+18" degrees in the third step to make the rotation of the rotary table 2 asynchronous with the gas supply start timing of the reaction gas nozzle 32. In FIG. 7, L1 indicates a case (asynchronous) where the rotary table 2 was rotated at a rotational speed of 3 rpm and 1 second was added to the rotation time of the rotary table 2 at the third step, and Lo indicates a case (synchronous) where 1 second was not added to the rotation time (i.e., the rotation time was unchanged).

As indicated by solid lines in FIG. 7, the film thicknesses of the substrates are substantially uniform in both of the case L1 and the case Lo.

On the other hand, as indicated by dotted lines in FIG. 7, the variation of the film thickness within the surface of each substrate in the case L1 is smaller than that in the case Lo. The results indicate that the variation of the film thickness within the surface of each substrate can be reduced by making the rotation of the rotary table 2 asynchronous with the gas supply start timing of the reaction gas nozzle 32. Thus, when processing multiple substrates, the controllability of a film deposition process and the uniformity of the film thickness within the surface of each substrate can be improved by making the rotation of the rotary table 2 asynchronous with the gas supply start timing of the reaction gas nozzle 32.

(Experiment 2)

Figure 8:
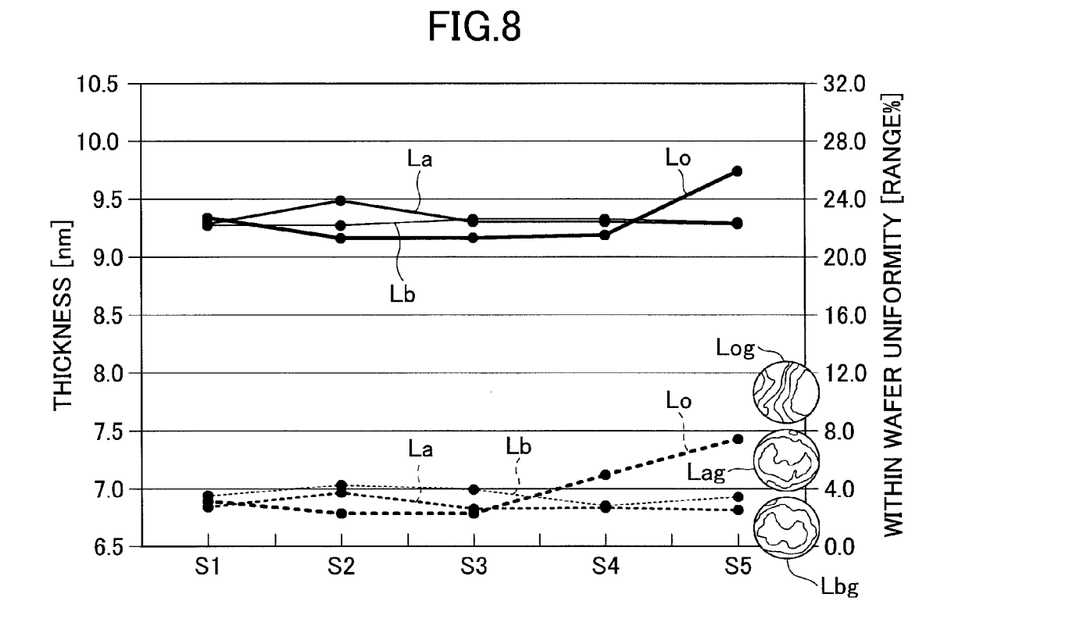
FIG. 8 is another graph illustrating results of an experiment.

FIG. 8 is graph illustrating results of an experiment 2 performed to evaluate the film deposition method of the present embodiment.

In the experiment 2, a laminated film was formed on the surface of each substrate. The horizontal axis of FIG. 8 indicates substrates W (S1 through S5) placed in the recesses 24 of the rotary table 2. In FIG. 8, solid lines represent film thicknesses indicated by the left vertical axis. In FIG. 8, dotted lines represent variation of film thickness (within the same substrate) indicated by the right vertical axis.

Also in the experiment 2, the rotary table 2 was rotated by "360+18" degrees or "360−18" degrees at the third step to make the rotation of the rotary table 2 asynchronous with the gas supply start timing of the reaction gas nozzle 32. In FIG. 8, La indicates a case (asynchronous) where the rotary table 2 was rotated at a rotational speed of 6 rpm and 0.5 seconds were added to the rotation time of the rotary table 2 at the third step, Lb indicates a case (asynchronous) where 0.5 seconds were subtracted from the rotation time, and Lo indicates a case (synchronous) where 0.5 seconds were not added and subtracted to and from the rotation time (i.e., the rotation time was unchanged).

As indicated by solid lines in FIG. 8, the variation in the film thickness among the substrates in the cases La and Lb is smaller than that in the case Lo. This result indicates that the variation in the film thickness among substrates can be reduced by making the rotation of the rotary table 2 asynchronous with the gas supply start timing of the reaction gas nozzle 32. Also, the variation in the film thickness among the substrates is smaller in the case Lb where the rotary table 2 is rotated by "360−18" degrees than in the case La where the rotary table 2 is rotated by "360+18" degrees. This result indicates that the variation in the film thickness among substrates can be further reduced when the rotation of the rotary table 2 is made asynchronous with the gas supply start timing of the reaction gas nozzle 32 by reducing (−18 degrees) the rotational angle of the rotary table 2.

As indicated by dotted lines in FIG. 8, the variation of the film thickness within the surface of each substrate in the cases La and Lb is smaller than that in the case Lo. This result indicates that the variation of the film thickness within the surface of each substrate can be reduced by making the rotation of the rotary table 2 asynchronous with the gas supply start timing of the reaction gas nozzle 32. Also in FIG. 8, Log indicates a film thickness distribution within the surface of the substrate S5 in the case Lo, Lag indicates a film thickness distribution within the surface of the substrate S5 in the case La, and Lbg indicates a film thickness distribution within the surface of the substrate S5 in the case Lb. As indicated by the film thickness distribution Log, in the case Lo, the film thickness in an area on the surface of the substrate S5 is greater than the film thickness in other areas on the surface of the substrate S5. That is, compared with the film thickness distributions Lag and Lbg, the film thickness distribution Log is uneven. This result indicates that the variation in the film thickness among substrates and within the substrate surface can be reduced by making the rotation of the rotary table 2 asynchronous with the gas supply start timing of the reaction gas nozzle 32 (or by shifting the timing to supply a reaction gas).

As described above, the film deposition method of the present embodiment makes it possible to evenly deposit one molecular layer of the ZrO layer and one molecular layer of the AlO layer on the surfaces of multiple substrates, and thereby makes it possible to form a thin film with a uniform thickness on the surface of each substrate and to form thin films with a uniform thickness on the surfaces of multiple substrates. The film deposition method of the present embodiment also makes it possible to form a reaction product made of an Al-doped ZrO layer on the substrate surface, and thereby makes it possible to form a dielectric layer having a high dielectric constant and an excellent leak characteristic (i.e., high dielectric strength).

In the above embodiment and experiments, the $O_3$ gas is used as an oxidation gas for oxidizing the TEMAZ gas or the TMA gas adsorbed onto the surface of the substrate W. Alternatively, an oxygen ($O_2$) plasma, a nitric oxide ($NO_x$) gas, or a $H_2O$ gas may be used as the oxidation gas. When the $O_2$ plasma is used, it is preferable to provide a plasma generator in the vacuum chamber 1. An exemplary plasma generator may be implemented by two rod-shaped electrodes that are disposed parallel to each other and also parallel to the rotary table 2. In this case, an $O_2$ gas is supplied to a space between the electrodes and a high-frequency power is applied between the electrodes to generate the $O_2$ plasma. This type of plasma generator is referred to as a capacitive coupling (CCP) plasma generator. Also, instead of a capacitive coupled (CCP) plasma generator, an inductively-coupled (ICP) plasma generator may be used.

In the above embodiment and experiments, the TEMAZ gas and the TMA gas are used as reaction gases. However, any source gas including zirconium (e.g., tris(dimethylamino) cyclopentadienyl zirconium) may be used instead of the TEMAZ gas. Also, any source gas including aluminum (e.g., organometallic aluminum such as triethylaluminum) may be used instead of the TMA gas.

In the above embodiment and experiments, it is assumed that an Al-doped ZrO film is formed. However, the film deposition method of the present embodiment may also be used to controllably and uniformly add an impurity to an oxide film of, for example, tantalum (Ta), hafnium (Hf), lanthanum (La), strontium (Sr), titanium (Ti), niobium (Nb), or silicon (Si).

An aspect of this disclosure provides an atomic layer (or molecular layer) film deposition method, a film deposition apparatus, and a storage medium storing a program for causing the film deposition apparatus to perform the film deposition method that make it possible to improve the controllability of a film deposition process and improve the uniformity of a thin film on each substrate and the uniformity of thin films on multiple substrates.

A film deposition method, a film deposition apparatus, and a storage medium storing a program for causing the film deposition apparatus to perform the film deposition method according to the preferred embodiments are described above. However, the present invention is not limited to the specifically disclosed embodiments, and variations and modifications may be made without departing from the scope of the present invention.

What is claimed is:

1. A method performed by a film deposition apparatus that includes
    a rotary table on which a plurality of substrates are placed,
    a first gas supplying part disposed in a first process area above the rotary table,
    a second gas supplying part disposed in a second process area that is above the rotary table and apart from the first process area along a circumferential direction of the rotary table, and
    a separation gas supplying part disposed in a separation area provided between the first process area and the second process area,
    the method comprising:
        a first step of rotating the rotary table by a first angle while supplying a separation gas from the separation gas supplying part and a first reaction gas from the first gas supplying part;
        a second step of supplying a second reaction gas from the second gas supplying part and rotating the rotary table by a second angle while supplying the separation gas from the separation gas supplying part and the first reaction gas from the first gas supplying part;
        a third step of rotating the rotary table by a third angle while supplying the separation gas from the separation gas supplying part and the first reaction gas from the first gas supplying part; and
        a fourth step of supplying a third reaction gas from the second gas supplying part and rotating the rotary table by a fourth angle while supplying the separation gas from the separation gas supplying part and the first reaction gas from the first gas supplying part, wherein positions in the rotary table where the first gas supplying part and the second gas supplying part start supplying the gases are moved by a predetermined angle in a rotation direction of the rotary table every time a cycle including the first step, the second step, the third step and the fourth step is repeated.

2. The method as claimed in claim 1, wherein a sum of the first angle, the second angle, the third angle, and the fourth angle is not an integral multiple of 360 degrees.

3. The method as claimed in claim 1, wherein a sum of the first angle and the third angle is greater than or equal to 60 degrees and less than 360 degrees or is greater than 360 degrees.

4. The method as claimed in claim 1,
wherein, in the second step, the second reaction gas is caused to be adsorbed onto a surface of a substrate on the rotary table by supplying the second reaction gas from the second gas supplying part while supplying the separation gas from the separation gas supplying part to separate the first process area and the second process area from each other;
wherein, in the third step, the second reaction gas adsorbed onto the surface of the substrate in the second step is caused to react with the first reaction gas to generate a first reaction product and deposit a thin film of the first reaction product on the surface of the substrate;
wherein, in the fourth step, the third reaction gas is caused to be adsorbed onto the surface of the substrate by supplying the third reaction gas from the second gas supplying part while supplying the separation gas from the separation gas supplying part to separate the first process area and the second process area from each other; and
wherein, in the first step, the third reaction gas adsorbed onto the surface of the substrate in the fourth step is caused to react with the first reaction gas to generate a second reaction product and deposit a thin film of the second reaction product on the surface of the substrate.

5. The method as claimed in claim 1, wherein the first step through the fourth step are repeated multiple times to form layers of reaction products on a surface of each of the substrates on the rotary table.

6. The method as claimed in claim 1, wherein in at least one of the first step and the third step, an inert gas is supplied from the second gas supplying part.

* * * * *